(12) United States Patent
Mendel et al.

(10) Patent No.: US 6,271,680 B1
(45) Date of Patent: *Aug. 7, 2001

(54) LOGIC ELEMENT FOR A PROGRAMMABLE LOGIC INTEGRATED CIRCUIT

(75) Inventors: David W. Mendel, Sunnyvale; Richard G. Cliff, Milpitas, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/606,250

(22) Filed: Jun. 28, 2000

Related U.S. Application Data

(63) Continuation of application No. 09/102,828, filed on Jun. 23, 1998, now Pat. No. 6,107,822, which is a continuation-in-part of application No. 08/835,557, filed on Apr. 8, 1997, now Pat. No. 5,986,465.

(60) Provisional application No. 60/011,422, filed on Apr. 9, 1996, and provisional application No. 60/014,629, filed on Apr. 9, 1996.

(51) Int. Cl.[7] .............................................. H03K 19/177
(52) U.S. Cl. .................................................. 326/40; 326/39
(58) Field of Search .......................................... 326/37–41

(56) References Cited

U.S. PATENT DOCUMENTS

| | | | |
|---|---|---|---|
| 4,609,986 | 9/1986 | Hartmann et al. | 364/200 |
| 4,617,479 | 10/1986 | Hartmann et al. | 307/465 |
| 4,677,318 | 6/1987 | Veenstra | 307/465 |
| 4,706,216 | 11/1987 | Carter | 365/94 |
| 4,713,792 | 12/1987 | Hartmann et al. | 364/900 |
| 4,831,591 | 5/1989 | Imazeki et al. | 365/189.08 |
| 4,871,930 | 10/1989 | Wong et al. | 307/465 |
| 4,899,067 | 2/1990 | So et al. | 307/465 |
| 4,903,223 | 2/1990 | Norman et al. | 364/716 |
| 4,912,342 | 3/1990 | Wong et al. | 307/465 |
| 4,975,601 | 12/1990 | Steele | 307/465 |
| 5,099,150 | 3/1992 | Steele | 307/465 |

(List continued on next page.)

FOREIGN PATENT DOCUMENTS

| | | |
|---|---|---|
| 0 227 329 | 7/1987 | (EP) . |
| WO 95/16993 | 6/1995 | (WO) . |

OTHER PUBLICATIONS

Altera Corporation, 1996 Data Sheet, Chapter 5, "MAX 7000 Programmbable Logic Device Family," Version 4, pp. 191–219, (Jun. 1996).

Altera Corporation, 1995 Data Sheet, "FLEX 10K Embedded Programmable Logic Family," Version 1. pp. 1–39, (Jul. 1995).

Altera Corporation, 1995 Data Sheet, "MAX 9000 Programmable Logic Device Family," Version 2, pp. 119–152, (Mar. 1995).

Altera Corporation, 1194 Data sheet, "FLEX 8000 Programmable Logic Device Family," Version 4, pp. 1–22, (Aug. 1994).

(List continued on next page.)

Primary Examiner—Michael Tokar
Assistant Examiner—Don Phu Le
(74) Attorney, Agent, or Firm—Townsend and Townsend and Crew LLP

(57) ABSTRACT

A logic element (300) for a programmable logic device. The logic element (300) allows two independent logic functions to be carried out during the same clock cycle. A 4-input look-up table (406) is provided using a 3-input look-up table (434) and two 2-input look-up tables. The results of the 4-input lookup table (406) and the 3-input lookup table (434) may be routed simultaneously from the logic element. It also allows a signal to be routed through a logic element (300) while carrying out an independent logic function. Carry logic (425) is provided. The results of the carry logic (486) may be routed to the global and local interconnect structure of the programmable logic device.

13 Claims, 5 Drawing Sheets

U.S. PATENT DOCUMENTS

| | | | |
|---|---|---|---|
| 5,121,006 | 6/1992 | Pedersen | 307/465 |
| 5,128,559 | 7/1992 | Steele | 307/465 |
| 5,144,582 | 9/1992 | Steele | 365/189.08 |
| 5,237,573 | 8/1993 | Dhuey et al. | 370/112 |
| 5,241,224 | 8/1993 | Pedersen et al. | 307/465 |
| 5,260,610 | 11/1993 | Pedersen et al. | 307/465 |
| 5,260,611 | 11/1993 | Cliff et al. | 307/465 |
| 5,350,954 | 9/1994 | Patel | 307/465 |
| 5,371,442 | 12/1994 | Patel et al. | 326/41 |
| 5,384,500 | 1/1995 | Hawes et al. | 326/39 |
| 5,963,050 | 10/1999 | Young et al. | 326/41 |
| B1 4,617,479 | 9/1993 | Hartmann et al. | 307/465 |

OTHER PUBLICATIONS

Altera Corporation, 1993 Data Sheet, "MAX 7000 Programmable Logic Device Family," Version 1, pp. 69–81, (Aug. 1993).

Xilinx Corporation, 1997 Data Sheet, "XC5200 Series Field Programmable Gate Arrays," Version 5.0, pp. 4–163 to 4–234 (Sep. 18, 1997).

Xilinx Corporation, 1995 Technical Data, "XC5200 Logic Cell Array Family," Preliminary Version 2.0, pp. 1–42, (May 1995).

Xilinx Corporation, The Programmable Logic Data Book, "XC 4000, XC4000A, XC4000H, Logic Cell Array Families," pp. 2–7, to 2–46, (1994).

Xilinx Corporation, The Programmable Logic Data Book, "XC3000, XC3000A, XC3000L, XC3100, XC3100A, Logic Cell Array Families," pp. 2–105 to 2–152, (1994).

Lucent Technologies Inc., 1997 Product Brief, "ORCA® OR2CxxA (5.0 V) and OR2TxxA (3.3 V) Series Field–Programmable Gate Arrays," 4 pages, (Jun. 1997).

Lucent Technologies Inc., 1996 Advance Product Brief, "Optimized Reconfigurable Cell Array (ORCA™) OR3Cxxx/OR3Txxx Series Field–Programmable Gate Arrays," 6 pages, (Dec. 1996).

LOGIC ELEMENT FOR A PROGRAMMABLE LOGIC INTEGRATED CIRCUIT

CROSS-REFERENCE TO RELATED CASES

This application is a continuation of Ser. No. 09/102,828 filed Jun. 23, 1998, U.S. Pat. No. 6,107,822. This application is a continuation-in-part of U.S. patent application Ser. No. 08/835,557, filed Apr. 8, 1997, now U.S. Pat. No. 5,986,465, which claims the benefit of U.S. Provisional Application No. 60/011,422, filed Apr. 9, 1996 and U.S. Provisional Application No. 60/014,629, filed Apr. 9, 1996, all of which are incorporated herein by reference for all purposes.

BACKGROUND OF THE INVENTION

The present invent-on relates to the field of programmable logic devices, and more particularly, to programmable logic devices having highly flexible and efficient logic elements.

Logic devices and methods of their operation are well known to those of skill in the art. Programmable logic devices have found particularly wide application as a result of their combined low up-front cost and versatility to the user.

Altera's FLEX® and MAX® lines of programmable logic are among the most advanced and successful programmable logic devices. In the FLEX® 8000 logic devices, for example, a large matrix of logic elements (LEs), also known as logic cells (LCells) is utilized. In one commercial embodiment of such devices, each logic element effectively includes a 4-input logic block for performance of combinational logic (e.g., AND, OR, NOT, XOR, NAND, NOR, and many others) and a register that provides sequential logic features.

The logic elements are arranged in groups of, for example, eight to form larger logic array blocks (LABs). The LABs contain, among other things, a local interconnection structure. The various LABs are arranged in a two-dimensional array, with the various LABs connectable to each other and to I/O pins of the device though continuous lines that run the entire length/width of the device. These lines are referred to as row interconnect and column interconnect or collectively as "global" interconnect lines. In Altera's line of production these may include what are referred to as "Horizontal FastTracks™" and "Vertical Fast-Tracks™." Further details on the FLEX and MAX products are provided in Altera's databook.

These logic devices have met with substantial success and are considered pioneering in the area of programmable logic. While pioneering in the industry, certain limitations still remain. Notably, in applications that use currently available devices, some of the resources of the device may be wasted when performing certain functions.

For example, the resources of a 4-input logic element are not all used when performing a 3-input logic functions. Consequently, the remaining resources (i.e., one of the inputs and the unused logic functionality) are wasted. Currently available devices do not allow the results of more than one logic function to be provided by a single logic element.

In some commercial embodiments, lookup tables are used to provide the logic functions. Each logic element has one lookup table that provides an output based on the value on the logic element's inputs. Though the lookup table can perform combinational logic for the number of inputs the logic element provides, (e.g., a 4-input lookup table for a 4-input logic element,) the logic element is actually comprised of a number of smaller lookup tables (e.g., two 3-input lookup tables, one or both of which may be made up of two 2-input lookup tables.) Thus, if a logic element is used to perform a logic function for only three inputs, the other 3-input logic function is unused and wasted. Although illustrated herein by reference to a lookup table, other types of logic functions used in logic elements may be similarly wasted.

Further, often a logic element is used for rebuffering and routing of signals. In this scenario, only one of the inputs to the logic element is used, while the logic functions and remaining inputs of the logic element go unused. Again, this is a waste of inputs and logic resources on the logic device.

Finally, though existing devices provide for a carry function from one logic element to adjacent logic elements, these devices have no provisions for routing the carry function to the interconnect system of the PLD.

For at least the above reasons, a PLD which makes more efficient use of logic resources and provides greater interconnect flexibility is needed.

SUMMARY OF THE INVENTION

The present invention provides a logic element for a programmable logic device that is more flexible than previous logic elements. As such, the logic capabilities of the logic element may be used more effectively. It provides additional configuration options and signal paths for the logic element, without requiring a lot of additional space.

In particular, a logic element is provided that includes a logic function block capable of outputting the results of two independent logic functions, simultaneously. In the specific embodiment, the logic function block comprises two independent 3-input lookup tables. The two 3-input lookup tables may be configured as a 4-input lookup table with a single output, or they may be independently operated with each lookup table providing an independent logic function result. A path is provided for each of the logic function block outputs to an interconnect structure for the programmable logic device.

Carry logic also provided for generating carry results from arithmetic operations performed by the logic element. The present invention provides a path such that the carry results may be output from the logic element, simultaneously with a result from the logic function block.

A bypass path is also provided in the logic element for routing a signal from one of the inputs of the logic element to an output of the logic element without performing logical functions on the signal, while the other output terminal provides the result of a logical function based on the inputs to the logic element.

As will be recognized, the added flexibility of the present inventive logic element provides great advantages over the prior art. For example, the logic element may be used more effectively since resources that would have been left unused in previous logic elements may be put to beneficial use. For example, if less than all the inputs are being used for a logic element, another function may be performed with the same logic element.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Figure 1:
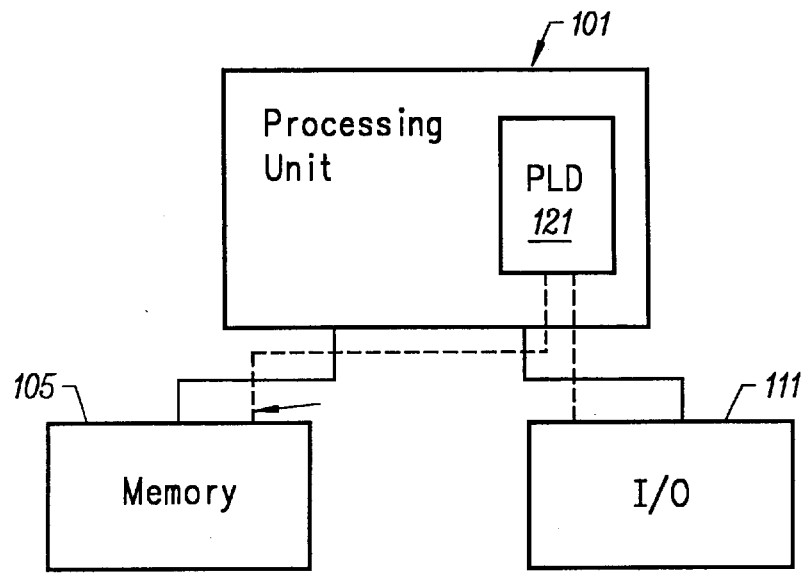
FIG. 1 is a diagram of a system incorporating a programmable logic device.

FIG. 1 illustrates a typical environment in which an integrated circuit having been designed according to the principles of the present invention may be embodied. A digital system 100 has a processing unit 101 that is coupled with a memory 105 and an input/output device 111. A personal computer is an example of digital system 100; however, a wide variety of electronic and consumer products will find beneficial use from the present invention. For example, the present invention will find application in telecommunications, switches, networks, and many other areas of technology.

Digital system 100 contains one or more programmable logic integrated circuits 121 of the type described in the present invention. Programmable logic integrated circuit 121 may be, for example, a programmable logic device (sometimes referred to as PALs, PLAs, FPLAs, PLDs, EPLDs, CPLDS, EEPLDS, LCAs, or FPGAs.) Programmable logic devices are described for example, in U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, U.S. patent application Ser. No. 08/835,552, filed Apr. 8, 1997, and the *Altera Data Book,* June 1996, all incorporated herein by reference. In FIG. 1, programmable logic integrated circuit 121 is shown as a part of processing unit 101, but, memory 105 or input/output device 111 may also advantageously contain programmable logic integrated circuit 121.

Figure 2:
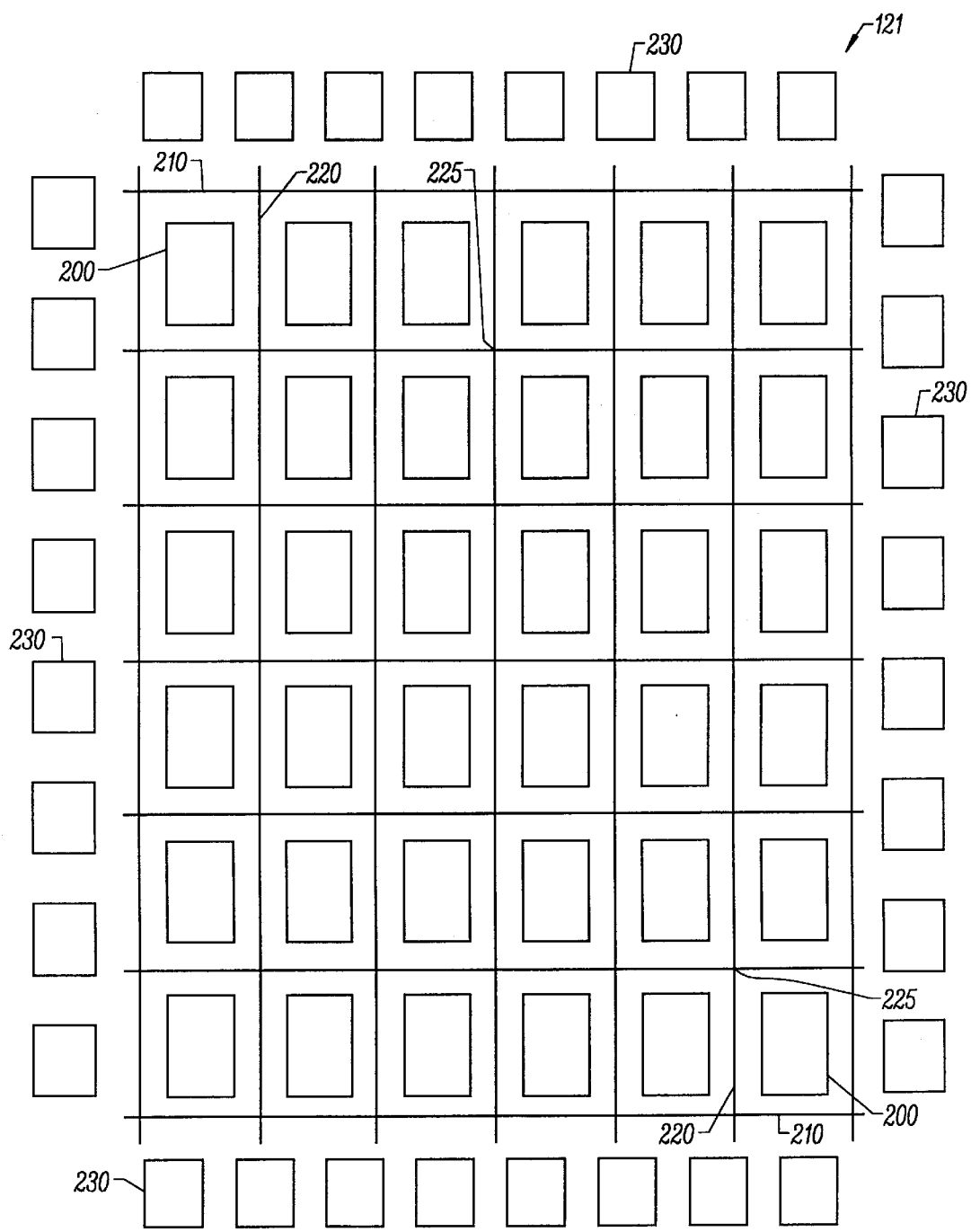
FIG. 2 is a block diagram showing the overall architecture of a programmable logic device incorporating the present invention.

FIG. 2 is a simplified block diagram of the overall internal architecture and organization of an exemplary PLD 121. Many details of PLD architecture, organization, and circuit design are not necessary for an understanding of the present invention and such details are not shown. The exemplary PLD of FIG. 2 shows an array of logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs 200, more or less than PLD 121 shown in FIG. 2.

LAB 200 has inputs and outputs (not shown) which may or may not be programmably connected to a global interconnect structure, represented in FIG. 2 by horizontal conductors 210 and vertical conductors 220. An exemplary global interconnect structure is described for example in the *Altera Data Book,* June 1996, previously incorporated by reference, and, for example, in U.S. Pat. Nos. 5,260,610 and 5,260,611, both of which are incorporated herein by reference for all purposes.

Figure 3:
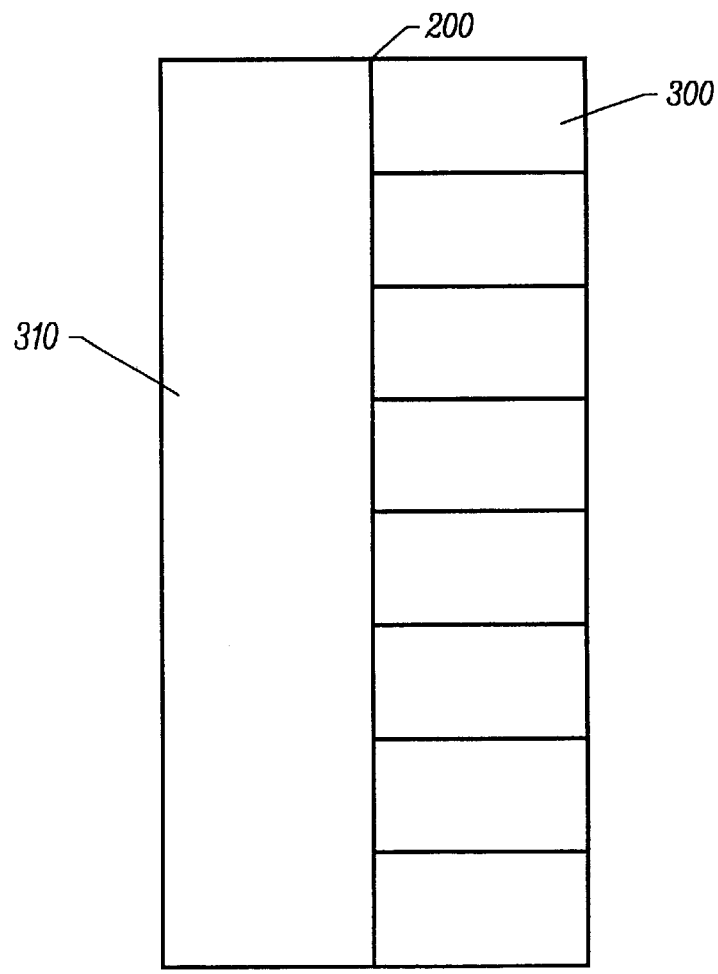
FIG. 3 is a simplified block diagram of a logic array block (LAB) of a programmable logic device.

FIG. 3 shows a simplified block diagram of LAB 200. LAB 200 is comprised of a varying number of logic elements (LEs) 300, sometimes referred to as "logic cells" or "macrocells." Some embodiments of LAB 200 may include a local (or internal) interconnect structure 310. In FIG. 3, LAB 200 has eight LEs 300, but LAB 200 may have any number of LEs, more or less than eight. In some embodiments, LAB 200 includes carry chains or parallel expander chains.

LE 300 is the smallest logical building block of a PLD. Signals external to the LAB, such as from horizontal conductors 210 and vertical conductors 220, are programmably connected to LE 300 through a local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. LE 300 provides combinatorial and registered outputs that are connectable to the horizontal conductors 210 and vertical conductors 220. Furthermore, the outputs from LE 300 may be internally fed back into local interconnect structure 310.

Of course, the principles of the present invention may be implemented in many other internal architectures for PLD 121 or LAB 200. For example, the present invention may be implemented in an architecture such as that of the Altera MAX 7000 series of devices, described, for example, in commonly assigned U.S. patent application Ser. No. 08/835, 552, filed Apr. 8, 1997, and The *Altera Data Book,* June 1996, pp. 191–261 which were previously incorporated by reference. Further, the present invention may be implemented in an architecture such as that of the Altera FLEX 6000 series of devices, described in The FLEX 6000 Data Sheet, June 1997, pp. 1–32, which is incorporated herein by reference for all purposes. The present invention may also be used in conjunction with other architectures currently known or later developed. The implementation of the present invention in such architectures will be readily understood by one of skill in the art, from the principles described in this specification.

Figure 4:
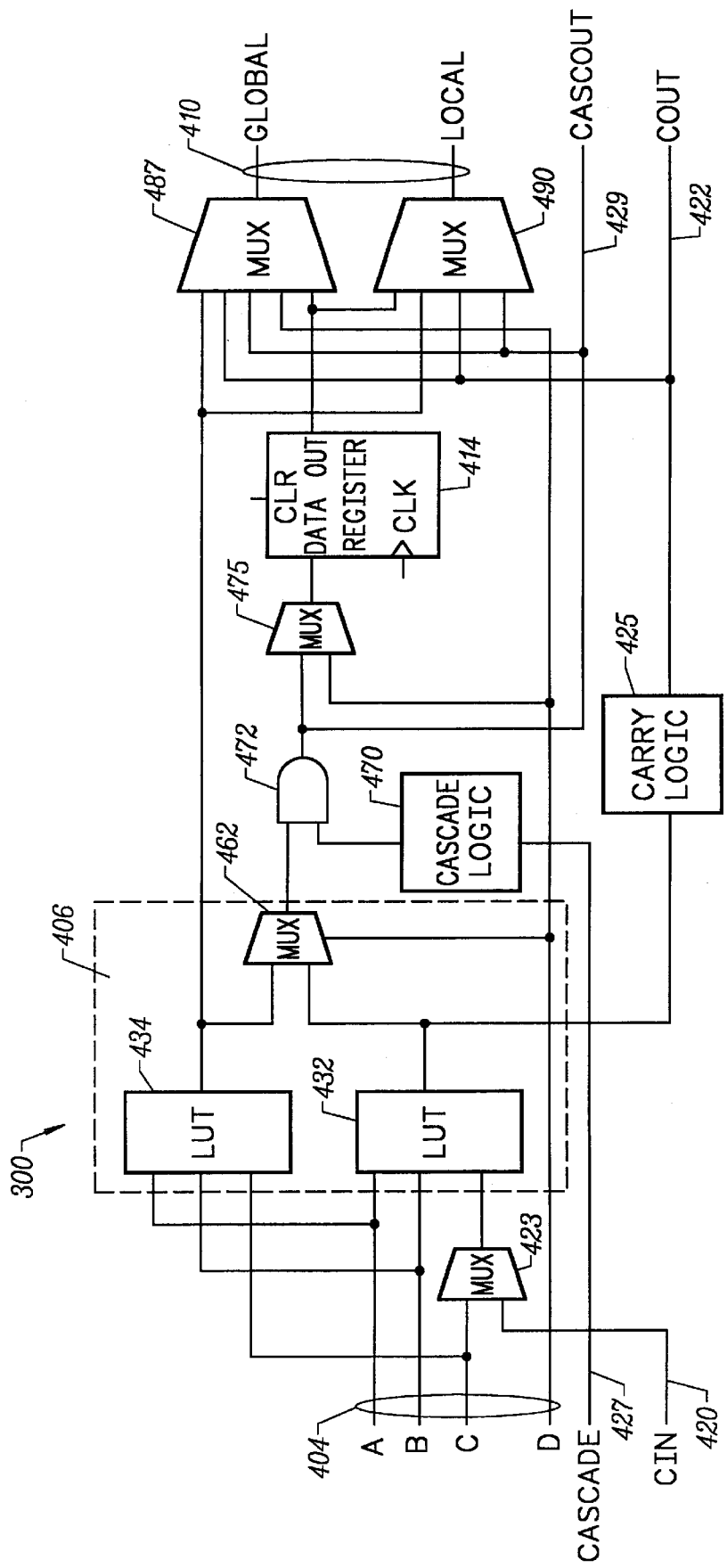
FIG. 4 is a simplified diagram of a logic element of the present invention.

FIG. 4 is a simplified diagram of a logic element or macrocell (LE 300) of the present invention. LE 300 includes a plurality of input terminals referred to collectively as logic input Terminals 404. In the specific embodiment, logic input terminals 404 may be programmably coupled to signals on the local interconnect of LAB 200, as well as the global interconnect and signals external to LAB 200. These are the input terminals upon which logic signals may be passed to LE 300 for the performance of logical operations. In the specific embodiment, logic input terminals 404 includes four terminals, A, B, C, and D. Of course, the number of input terminals may be include any number of terminals, with appropriate changes to LE 300 as will be recognized by one of skill in the art.

Various combinations of signals from logic input terminals 404 and other signals are fed into a logic function block 406, the operation of which is described in greater detail below. The results are output on output terminals 410. Sequential or combinatorial operation of LE 300 is available by selective use of a register 414. Although not shown, other inputs such as reset and clocking signals (not shown) may be provided to logic function block 406 to provide additional functionality.

LE 300 also has a carry in terminal (CIN) 420, and a carry out terminal (COUT) 422. Carry logic 425 provides logic for determining the value of a carry signal for arithmetic operations using LE 300, the operation of which will be well-known to one of skill in the art. Adjacent LEs 300 may use CIN 420 and COUT 422 to facilitate combining multiple LEs 300 for an arithmetic operation. A multiplexer 423 is provided to select between input logic terminal C and CIN 400 as the third input to logic function block 406.

LE 300 also has provisions to make direct connections between adjacent logic elements without using either the local LAB interconnect or the global interconnect. These provisions include a cascade input terminal CASC 427 and a cascade output terminal CASCOUT 429. By using these direct connection terminals, adjacent logic elements in an integrated circuit may concatenate their logic functions for more complex operation.

Logic function block 406 effectively operates as a 4-input boolean logic function generator. It outputs results based upon its input values. In the specific embodiment, logic function block 406 is comprised of two 3-input lookup tables (LUTs) 432 and 434. LUT 432 is further broken down into two 2-input lookup tables. This arrangement provides functionality similar to a 4-input LUT, with added flexibility and granularity. In further embodiments of the present invention, other types of logic modules may be used to implement logic function block 406. Such logic modules may include lookup tables, RAMs, FIFOs, registers, logic gates, and many others.

Logic input terminals A, B, and C are coupled to the inputs of each of LUTs 432 and 434. The results of LUT 434 are coupled to a first input for a multiplexer 462. The second input to multiplexer 462 is the output of LUT 432. The selector terminal of multiplexer 462 is coupled to input logic terminal D. This allows a signal on input logic terminal D to select between two different independent logic functions. In effect, this creates a 4-input logic function block with the output of multiplexer 462 being dependant on various combinations of logic function inputs A, B, C, and D.

The output of multiplexer 462 is coupled to a data input of register 414 through AND gate 472. The second input to AND gate 472 is coupled to cascade input 427. This allows the cascade input to be combined logically with the output of logic function block 406 to create more complex logic functions with adjacent logic elements without utilizing the interconnect resources.

In the specific embodiment, a multiplexer 475 selects between the output of AND gate 472 and input logic terminal D. This allows the register to store either the results of a logic function, or to perform as a "lonely register." The operation of a lonely register is described in commonly assigned U.S. patent application Ser. No. 08/835,552, filed Apr. 8, 1997, previously incorporated by reference for all purposes. Briefly, LE 300 may simultaneously output a registered output that is a function of a signal on input logic terminal D, and a combinatorial output that is a function of signals on input terminals A, B, C, and D.

Register 414 is a storage device. Any storage device may be used including various types of latches, flip-flops, registers, memory cells, and many others. For example, register 414 may be a T flip-flop, S-R flip-flop, J-K flip-flop, D flip-flop, or transparent latch.

A CLK input (not shown) of register 414 is used for clocking data into the register. The data may be clocked synchronously or a synchronously. Design of appropriate clocking signals will be readily apparent to one of skill in the art. A CLR input (not shown) is also provided to clear register 414.

LE 300 couples to global interconnect logic such as horizontal conductor 210 and vertical conductor 220 through output terminal GLOBAL and to local interconnect 310 through output terminal LOCAL. A multiplexer 487 selects between several inputs to provide an output for output terminal GLOBAL while another multiplexer 490 selects between several input to provide an output to output terminal LOCAL. In the specific embodiment, multiplexer 487 has five inputs and multiplexer 490 has four inputs, although more or fewer inputs may be included.

A first input to multiplexer 487 is coupled to input logic terminal D. This allows a signal on input logic terminal D to be routed through LE 300 for rebuffering or rerouting without being stored into register 414. Because it connects to the global output terminal, this allows great flexibility in routing signals throughout programmable logic integrated circuit 121.

A second input to multiplexer 487 is coupled to the output of register 414. Although not shown in FIG. 4, a path may be provided in some embodiments for for the output to be fed back to logic function block 406. This feedback path may be used to conserve interconnect resources while allowing the results during one clock cycle to be used for a logical operation in a subsequent cycle.

A third input to multiplexer 487 is coupled to the output of LUT 434. With this connection, the user has great flexibility in using LE 300. For example, the output of LUT 434 can be routed to output terminal GLOBAL while the output from multiplexer 462 (i.e., the output from logic function block 406) can be routed to register 414 through the path previously discussed. Consequently, LE 300 can do two independent logic functions of three variables during a particular clock cycle.

A fourth input to multiplexer 487 is coupled to the output of logic function block 406 providing combinatorial output of the results of the logic operation (bypassing register 414). The fourth input is take from the output of AND gate 472 to allow the CASCADE input to be included in the logical function. This provides added flexibility in routing the combinatorial signal throughout the integrated circuit, since the results can be coupled to any other part of programmable logic integrated circuit 121 through the global routing scheme, rather than simply to adjacent logic elements via the CASCOUT output.

Finally, a fifth input to multiplexer 487 is coupled to the carry out terminal 422. This path allows added flexibility in connecting the carry logic to other devices throughout the chip for performing arithmetic operations with more than one logic element.

Multiplexer 490 is coupled to provide some or all of the signals provided to output terminal GLOBAL to output terminal LOCAL. In the specific embodiment, the D-input terminal is not connected to output terminal LOCAL, since this connection may be made over local interconnect 310. However, nothing in the present invention prevents such a connection.

As will be seen by one skilled in the art, this arrangement allows great flexibility to the user in routing signals. By controlling which outputs are fed to the local and global terminals, a user can use LE 300 for doing a four input logic function, two independent three input logic functions, a route-through for one signal and a three input logic function, or many other combinations. Signals on COUT 422 and CASCOUT 429 terminals are also easily routed throughout programmable logic integrated circuit 121 through the interconnection scheme.

In the specific embodiment, multiplexers 423, 462, 475, 487 and 490 are controlled by programmable bits. These programmable bits allow the user to configure LE 300 for different modes of operation. These programmable bits may be implemented using cells from RAM, DRAM, SRAM, EEPROM, EPROM, fuse, antifuse, laser fuse, ferromagnetic, and other technologies. For example, a programmable bit may comprise a plurality of SRAM or EEPROM cells.

The implementations described herein merely illustrate the principles of the present invention, and many various circuit embodiments are possible. For example, a register may be placed between the output of LUT 434 and multiplexer 487 to store the results of LUT 434 for synchronous operation. Further, many other signals may be provided by various oaths to output terminals 410 by means of multiplexers 487 and 490. For example, a path may be provided directly from the output of one or more of the two 2-input LUTS in LUT 432.

Figure 5A:
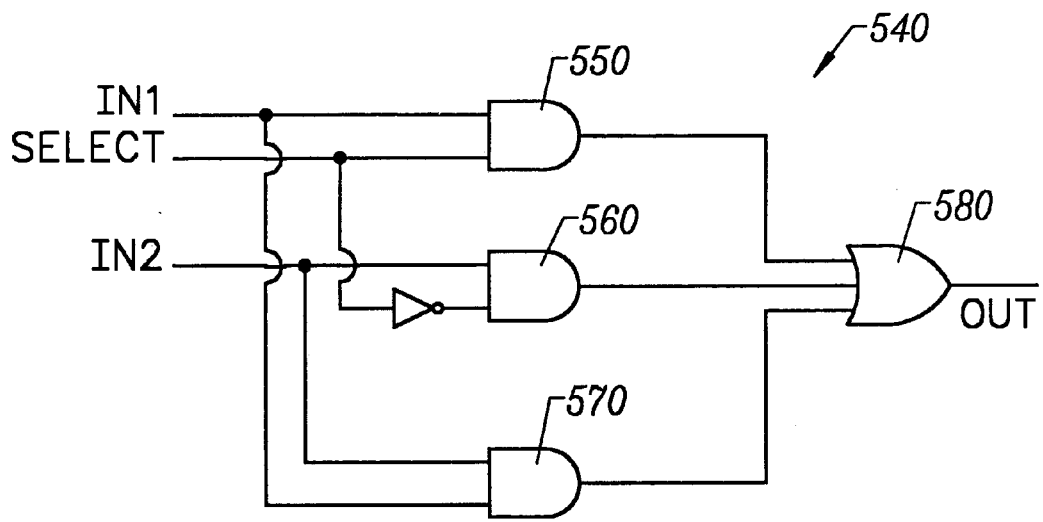
FIGS. 5A and 5B are schematic diagrams of a glitchless multiplexer.
Figure 5B:
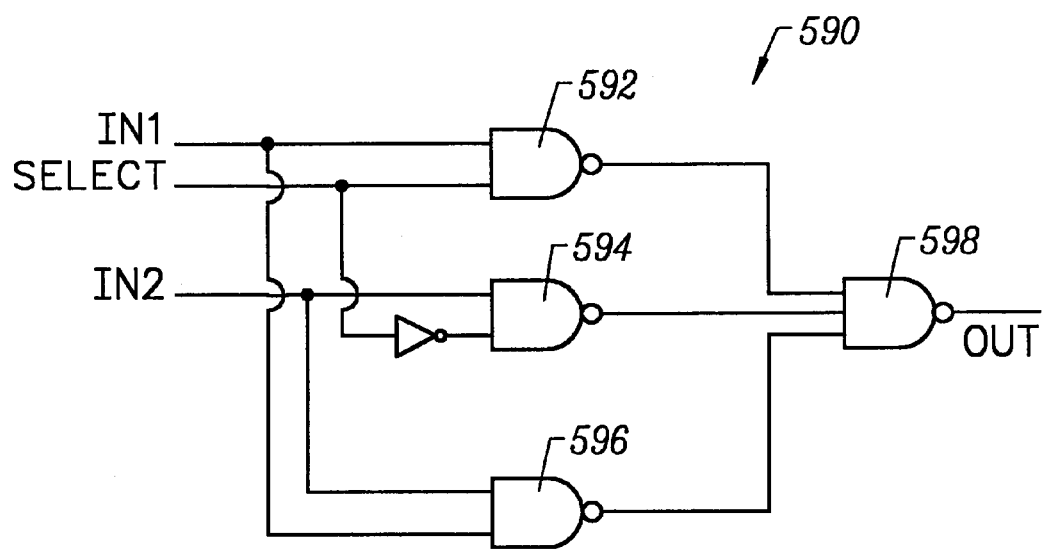

In an embodiment of the present invention, multiplexer 462 may be implemented with a glitchless multiplexer. FIG. 5A shows a schematic diagram of an exemplary glitchless multiplexer 540. Two inputs IN 1 and IN 2 are coupled to an input of AND gates 550 and 560, respectively. A select input is provided to the second input of each of AND gates 550 and 560. Both inputs IN 1 and IN 2 are also provided as the inputs to a third AND gate 570. The outputs of each of the AND gates 550, 560 and 570 are provided as the inputs to OR gate 580. Of course, OR gate 580 may be implemented using two 2-input OR gates or other combinations of logic gates producing similar results. The output from OR gate 580 is the output of glitchless multiplexer 540. Glitchless multiplexer 540 is advantageous for situations such as multiplexer 462, in which the select terminal is dependent on the same variable as one of the inputs. By providing redundant logic (i.e., AND gate 570), temporary glitches due to timing delays may be avoided. FIG. 5B shows a schematic diagram of an alternative embodiment of a glitchless multiplexer 590 in which NAND gates 592, 594, 596, and 598 are substituted for AND gates 550, 560, 570 and OR gate 580, respectively, of glitchless multiplexer 540 in FIG. 5A.

Figure 6:
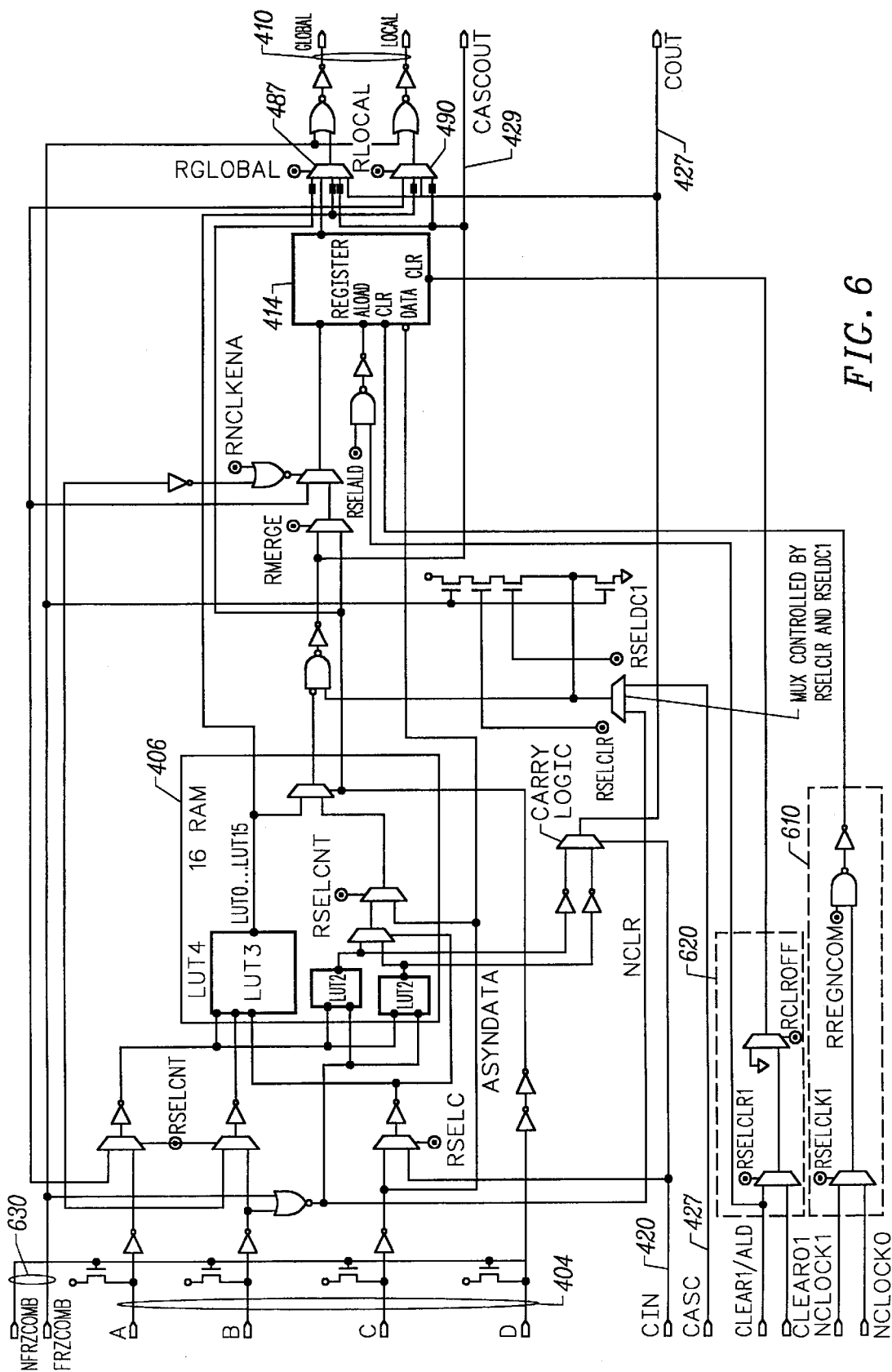
FIG. 6 is a more detailed diagram of an exemplary logic element according to the present invention.

FIG. 6 shows a more detailed embodiment of a specific embodiment of an LE 600 according to the present invention. Operation of LE 600 is somewhat similar to that of LE 300 of FIG. 4, however more of the details are shown. For example, clocking logic 610 is provided for controlling the clock for register 414. Also, reset logic 620 is provided for controlling the reset function for register 414. Additional inputs 630 are provided to disable logic element 600.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A logic element for a programmable logic device comprising:
    a first input terminal;
    a second input terminal;
    a logic function block coupled to the first and second input terminals and providing a first result;
    a storage device coupled to the first logic block and the first input terminal to selectively store the first result or a signal carried on the first input terminal; and
    a first output terminal coupled to the storage device.

2. The logic element of claim 1 wherein the first output terminal is coupled to the first input terminal and to the storage device to selectively output a signal carried on the first input terminal or the contents of the storage device.

3. The logic element of claim 2 further comprising a second output terminal, wherein the second output terminal selectively outputs the contents of the storage device or the signal carried on the first input terminal.

4. The logic element of claim 1 wherein the logic function block further comprises:
    a first lookup table producing a second result;
    a second lookup table producing a third result; and
    control circuitry coupled to the first lookup table and the second lookup table to produce the first result based on the second result and the third result.

5. The logic element of claim 1 wherein the control circuitry is also coupled to the first input terminal, wherein the first result is also based on the signal carried on the first input terminal.

6. The logic element of claim 4 further comprising a third output terminal coupled to the control circuitry to output the first result.

7. A programmable logic device comprising the logic element of claim 1.

8. The programmable logic device of claim 7 further comprising an interconnect structure coupled to the first input terminal, the second input terminal and the first output terminal.

9. A logic element for a programmable logic device comprising:
    a first input terminal;
    a second input terminal;
    a first logic function block coupled to the first input terminal and the second input terminal and producing a first result;
    a second logic function block coupled to the first input terminal and the second input terminal and producing a second result, wherein the second logic function block includes the first logic function block;
    selection logic coupled to the first input terminal and the second logic function block, wherein the selection logic selectively outputs a signal on the first input terminal or the second result;
    a storage register coupled to the selection logic; and
    a first output terminal coupled to the storage register and the first logic function block to selectively output the stored signal from the selection logic or the first result.

10. The logic element of claim 9 wherein the first output terminal is coupled to the first input terminal, wherein the first output terminal may selectively output a signal carried on the first input terminal.

11. The logic element of claim 9 further comprising a second output terminal coupled to the storage register and the first logic function to selectively output the stored signal from the selection logic or the first result.

12. A programmable logic integrated circuit comprising:
    an interconnect structure;

logic means connected to the interconnect structure to calculate a first logic result and a second logic result;

storing means connected to the interconnect to selectively store a signal from the interconnect structure or the first logic result; and output means connected to the storing means to selectively output the second logic result or the stored signal.

13. The programmable logic integrated circuit of claim 12 wherein the output means may also selectively output a signal from the interconnect structure.

* * * * *